US012684856B2

(12) United States Patent
Lin et al.

(10) Patent No.: US 12,684,856 B2
(45) Date of Patent: Jul. 14, 2026

(54) SEMICONDUCTOR DEVICE WITH COMPOSITIONALLY VARIED HAFNIUM-CONTAINING DIELECTRIC LAYERS AND FABRICATION METHOD THEREOF

(71) Applicant: Taiwan Semiconductor Manufacturing Company, Ltd., Hsinchu (TW)

(72) Inventors: Bo-Jiun Lin, Hsinchu County (TW); Tsung-En Lee, Taipei City (TW); Tung-Ying Lee, Hsinchu City (TW); Chao-Ching Cheng, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 433 days.

(21) Appl. No.: 18/333,508

(22) Filed: Jun. 12, 2023

(65) Prior Publication Data

US 2024/0413222 A1 Dec. 12, 2024

(51) Int. Cl.
| | |
|---|---|
| *H10D 64/68* | (2025.01) |
| *H10D 30/01* | (2025.01) |
| *H10D 30/60* | (2025.01) |

(52) U.S. Cl.
CPC ......... *H10D 64/691* (2025.01); *H10D 30/021* (2025.01); *H10D 30/60* (2025.01); *H10D 64/685* (2025.01)

(58) Field of Classification Search
CPC ............ H01L 21/31645; H10D 30/014; H10D 30/017; H10D 30/021; H10D 30/43; H10D 30/481; H10D 30/60; H10D 64/685
See application file for complete search history.

(56) References Cited

U.S. PATENT DOCUMENTS

| | | | | |
|---|---|---|---|---|
| 9,721,963 | B1 * | 8/2017 | Rabkin | H10D 62/292 |
| 10,510,903 | B2 * | 12/2019 | Hou | H10D 30/675 |
| 2009/0278120 | A1 * | 11/2009 | Lee | H10D 30/6739 |
| | | | | 257/E29.296 |
| 2015/0349130 | A1 * | 12/2015 | Tanemura | H10D 86/021 |
| | | | | 257/43 |
| 2020/0091274 | A1 * | 3/2020 | Sharma | H10D 64/689 |
| 2024/0072054 | A1 * | 2/2024 | Tu | H10D 84/856 |
| 2024/0387710 | A1 * | 11/2024 | Lin | H01L 23/5283 |

* cited by examiner

*Primary Examiner* — Wael M Fahmy
*Assistant Examiner* — Shamita S Hanumasagar
(74) *Attorney, Agent, or Firm* — JCIPRNET

(57) ABSTRACT

A semiconductor device and a manufacturing method thereof are provided. The semiconductor device includes a channel layer, an adhesion layer disposed over the channel layer, a first hafnium-containing dielectric layer disposed over the adhesion layer, a second hafnium-containing dielectric layer disposed over the first hafnium-containing dielectric layer, a gate structure, and source and drain terminals. The second hafnium-containing dielectric layer has a hafnium content lower than a hafnium content of the first hafnium-containing dielectric layer. A dielectric constant of the second hafnium-containing dielectric layer is larger than a dielectric constant of the first hafnium-containing dielectric layer.

20 Claims, 12 Drawing Sheets

SEMICONDUCTOR DEVICE WITH COMPOSITIONALLY VARIED HAFNIUM-CONTAINING DIELECTRIC LAYERS AND FABRICATION METHOD THEREOF

BACKGROUND

In the semiconductor manufacturing industry, the demand to reduce the critical dimensions of the integrated circuits and increasing the performance of semiconductor devices is high.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
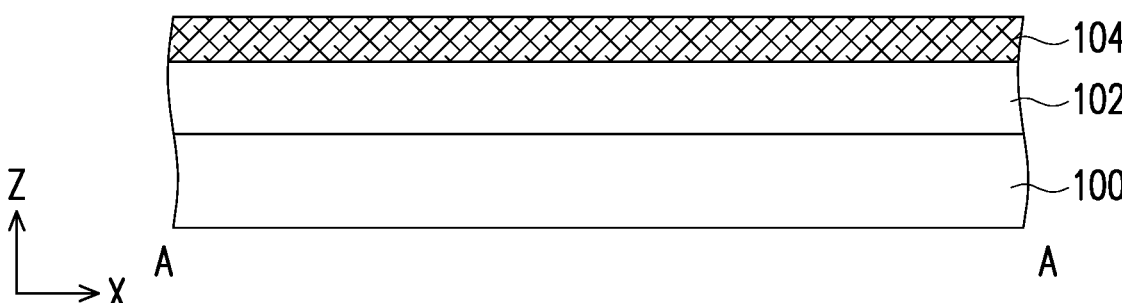
FIG. 1 to FIG. 14 are schematic cross-sectional views and top views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The embodiments are intended to provide further explanations but are not used to limit the scope of the present disclosure. The specific embodiment(s) described herein is related to a structure containing one or more semiconductor devices, and is not intended to limit the scope of the present disclosure. Embodiments of the present disclosure describe the exemplary manufacturing process of the structure(s) formed with one or more semiconductor devices such as transistors and the integration structures fabricated there-from. Certain embodiments of the present disclosure are related to the structures including semiconductor transistors and other elements. The substrates and/or wafers may include one or more types of integrated circuits or electronic components therein. The semiconductor device(s) may be formed on a bulk semiconductor substrate or a silicon/germanium-on-insulator substrate.

The embodiments of the present disclosure have some advantageous features as described below. A semiconductor device comprises a composite hafnium-containing dielectric layer over the channel layer. The composite hafnium-containing dielectric layer includes a first hafnium-containing dielectric layer and a second hafnium-containing dielectric layer disposed over the first hafnium-containing dielectric layer. In some embodiments, the second hafnium-containing dielectric layer further includes zirconium. The dielectric constant of the second hafnium-containing dielectric layer is higher than the dielectric constant of the first hafnium-containing dielectric layer. Through the formation of the composite hafnium-containing dielectric layer, the formed semiconductor device offers an improved subthreshold swing (SS) performance and excellent transition rates between on and off states. Besides, the semiconductor device is formed with a reduced equivalent oxide thickness (EOT), and the semiconductor device maintains a low leakage current and a satisfactory breakdown voltage ($V_{BD}$) at the same time. Overall, the performance of the semiconductor device is enhanced. Embodiments discussed herein are to provide examples to enable making or using the subject matter of this disclosure, and a person having ordinary skill in the art will readily understand modifications that can be made while remaining within contemplated scopes of different embodiments.

FIG. 1 to FIG. 14 are schematic cross-sectional views and top views of various stages in a manufacturing method of a semiconductor device in accordance with some embodiments of the disclosure. In FIGS. 1, 3, 5, 7, 9, 10, 12 and 14, schematic cross-section views of the semiconductor device are shown, while in FIGS. 2, 4, 6, 8, 11 and 13, schematic top views of the semiconductor device are shown.

Figure 2:
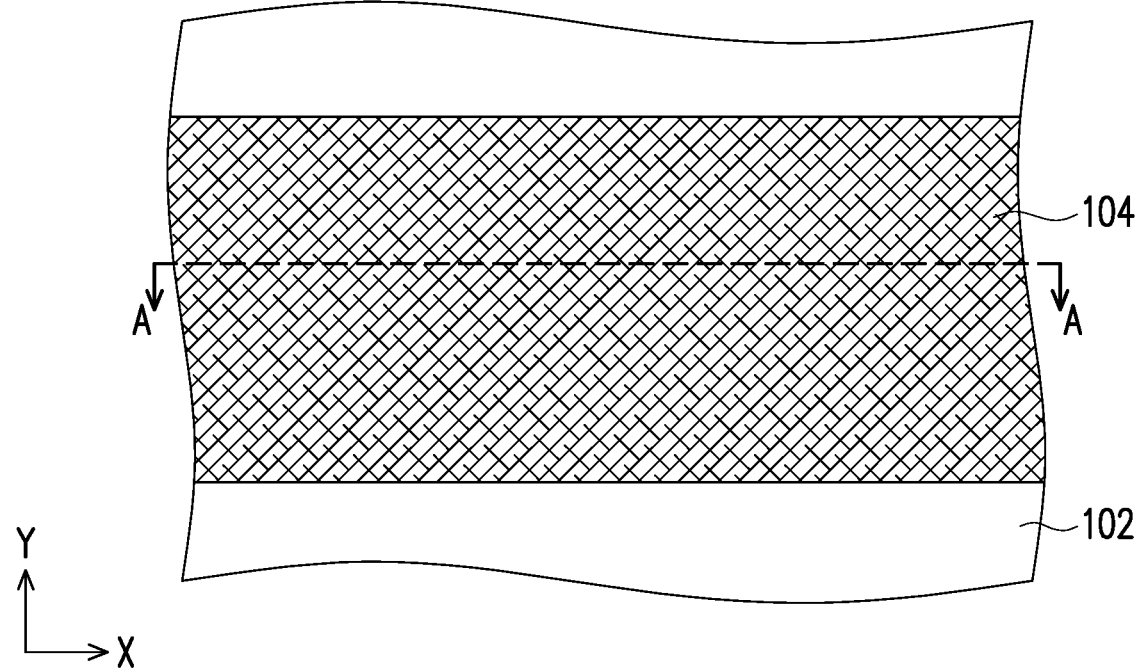

FIG. 1 shows a schematic cross-sectional view of a structure shown in FIG. 2 along cross-section line A-A. From the top view of FIG. 2, the substrate 100 extends along a X-Y plane, which extends along a direction X and along a direction Y intersecting with the direction X. Referring to FIGS. 1 and 2, in some embodiments, a substrate 100, an overlay layer 102 formed on the substrate 100, a channel layer 104 formed on the overlay layer 102 are provided. In some embodiments, the overlay layer 102 is formed over the substrate 100. In some embodiments, the overlay layer 102 may be formed with a pattern (such as strip shaped, tetragonal or polygonal shape pattern). Later, a channel layer 104 is formed on the overlay layer 102 over the substrate 100. In some embodiments, the channel layer 104 may be formed as a sheet, and the span/area of the channel layer 104 is smaller than the span/area of the overlay layer 102. From the schematic top view of FIG. 2, the overlay layer 102 are not fully covered by the channel layer 104, and portions of the overlay layer 102 are exposed from the channel layer 104.

In some embodiments, the substrate 100 includes a semiconductor substrate. In one embodiment, the substrate 100 comprises a bulk semiconductor substrate such as a crystalline silicon substrate, or a doped semiconductor substrate (e.g., p-type or n-type semiconductor substrate). In one embodiment, the substrate 100 may be a p-type semiconductor substrate. In one embodiment, the substrate 100 comprises a silicon-on-insulator substrate or a germanium-on-insulator substrate. In certain embodiments, the substrate 100 includes one or more doped regions or various types of doped regions, depending on design requirements. In some embodiments, the doped regions are doped with p-type and/or n-type dopants. For example, the p-type dopants are boron or $BF_2$ and the n-type dopants are phosphorus or arsenic. In some embodiments, the substrate 100 includes a semiconductor substrate made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, the overlay layer 102 includes a nitride layer such as a silicon nitride layer. The overlay layer 102 is disposed between the substrate 100 and the channel layer 104. In some embodiments, the overlay layer 102 may function to enhance the heat dissipation of the above layers and/or improve the performance of the transistor structure. In alternative embodiments, the overlay layer 102 is optional and may be omitted.

In some embodiments, the channel layer 104 is formed and transferred to the overlay layer 102 by a transfer carrier (not shown). The formation of the channel layer 104 involves the methods of pulse laser deposition (PLD), chemical vapor deposition (CVD), plasma-enhanced atomic layer deposition (PEALD), solution based chemical synthesis and/or mechanical or liquid exfoliation. In some embodiments, an annealing process is also performed.

Alternatively, in some embodiments, the channel layer 104 may be formed through a growth process over the overlay layer 102 and the substrate 100. The growth process utilizing patterned nucleation seeds is a well-controlled process and may be performed on-site (at the same location). In some embodiments, the growth process includes a CVD process. The CVD process may include a process performed by, for example, electron cyclotron resonance CVD (ECR-CVD), microwave plasma CVD, plasma enhanced CVD (PECVD), low-pressure CVD (LPCVD), thermal CVD or hot filament CVD. In other embodiments, the growth process is a physical vapor deposition (PVD) process. Compared with the transferring formation method, the growth process is well applicable for high density or fine pitch integrated circuitry.

In one embodiment, the channel layer 104 is provided and disposed on the overlay layer 102 over the substrate 100 at a predetermined location within a device region defined by the overlay layer 102. In some embodiments, the channel layer 104 has a thickness ranging from about 0.3 nm to about 5.0 nm, or from about 0.7 nm to about 1.0 nm.

In some embodiments, a material of the channel layer 104 is or includes a low-dimensional material. For example, the low-dimensional materials include nanoparticles, one-dimensional (1D) materials (e.g. carbon nanotubes (CNT) or nanowires) and two-dimensional (2D) materials including graphene, hexagonal boron nitride (h-BN), black phosphorus, and transition metal dichalcogenides (TMDs). Among the 2D materials, different types of 2D materials may be classified based on their behaviors as semiconducting 2D materials (e.g. 2H TMDs), metallic 2D materials (e.g. 1T TMDs), and insulating 2D materials (e.g. h-BN). TMDs have the chemical formula $MX_2$, where M is a transition metal such as titanium (Ti), zirconium (Zr), hafnium (Hf), vanadium (V), niobium (Nb), tantalum (Ta), molybdenum (Mo), tungsten (W), technetium (Tc), rhenium (Re), cobalt (Co), rhodium (Rh), iridium (Ir), nickel (Ni), palladium (Pd), platinum (Pt), and X is a chalcogen such as sulfur(S), selenium (Se) or tellurium (Te). For TMDs having various crystal structures, the most common crystal structure is the 2H-phase with trigonal symmetry, which results in semiconducting characteristics (e.g. $MoS_2$, $WS_2$, $MoSe_2$ or $WSe_2$). Another possible crystal structure of TMDs is the 1T phase, which results in metallic characteristics (e.g. $WTe_2$).

TMD bulk crystals are formed of monolayers bound to each other by Van-der-Waals attraction. TMD monolayers have a direct band gap, and may be used in electronic devices to form TMD-based field-effect transistors (TMD-FETs).

In some embodiments, a material of the channel layer 104 is or includes one or more types of TMDs (Transition Metal Dichalcogenides). In some embodiments, a material of the channel layer 104 is or includes $MoS_2$ or $WS_2$.

Figure 3:
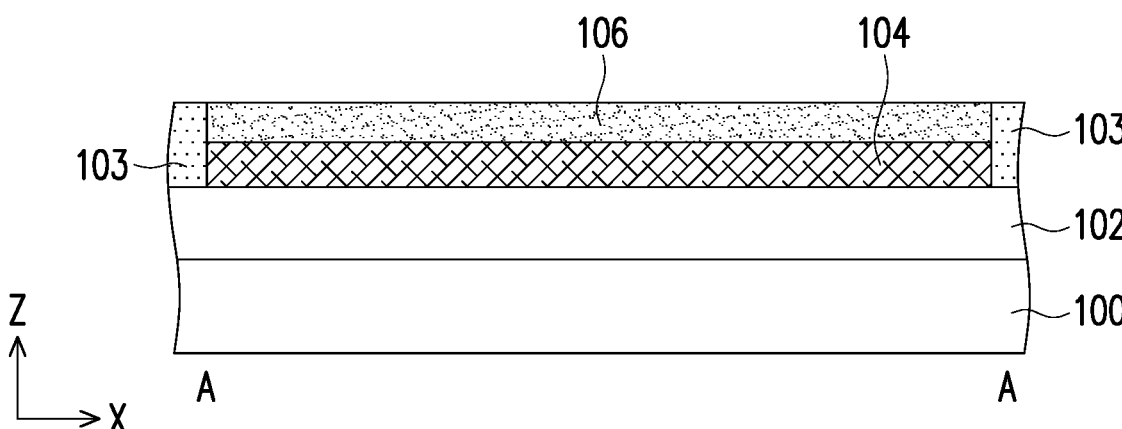
Figure 4:
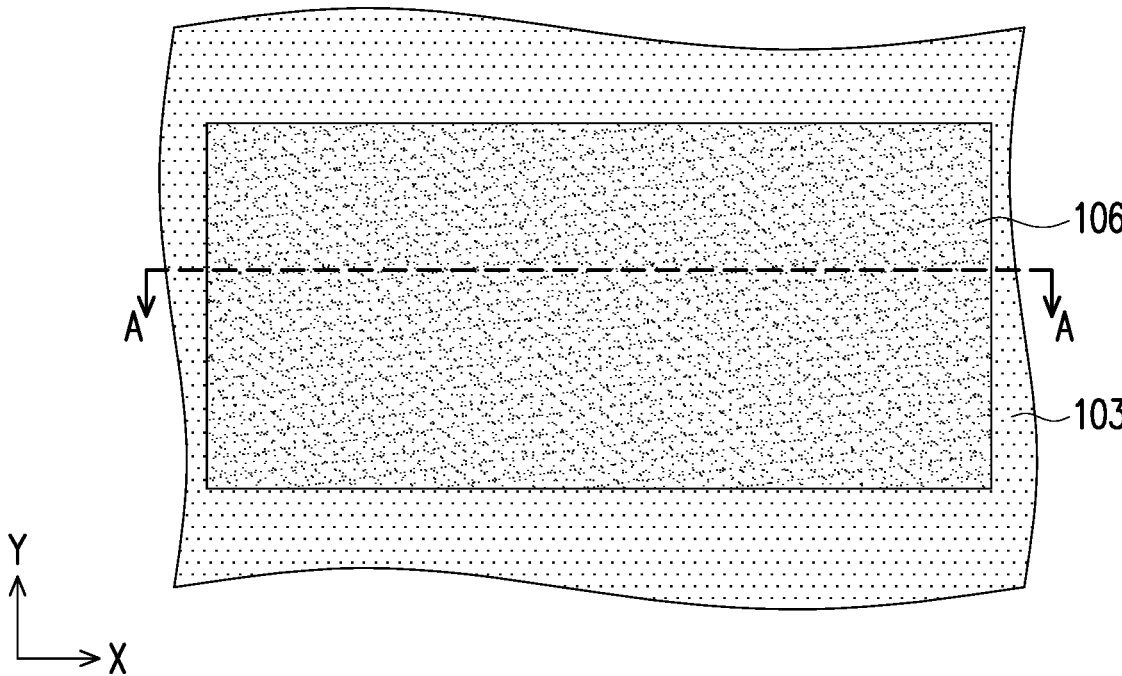

FIG. 3 shows a schematic cross-sectional view of a structure shown in FIG. 4 along cross-section line A-A. Referring to FIGS. 3 and 4, in some embodiments, an adhesion layer 106 is formed on the channel layer 104 and over the overlay layer 102 and the substrate 100. In some embodiments, the adhesion layer 106 is formed by blanketly depositing over the channel layer 104 and the underlying overlay layer 102 and substrate 100, and then performing a patterning process to pattern the adhesion layer 106 along with the underlying channel layer 104. In some embodiments, the patterning process may involves performing one or more of e-beam lithographic processes and reaction ion etching (RIE) processes.

From the top view of FIG. 4, the channel layer 104 and the adhesion layer 106 are patterned to form a rectangular pattern. In some embodiments, the channel layer 104 and the adhesion layer 106 are patterned by the same patterning process to have the same pattern. Herein, it is understood that the pattern may be strip-shaped, rectangular, tetragonal or polygonal shape(s). In some embodiments, after patterning, the pattern area of the channel layer 104 is the same as the pattern area of the adhesion layer 106. In some embodiments, the area/span of the channel layer 104 extending over the substrate 100 is defined by isolation structure(s) 103 surrounding the pattern of the channel layer 104 and the adhesion layer 106.

In some other embodiments, the pattern of the channel layer 104 may be different from the pattern of the adhesion layer 106 if patterned through different patterning processes.

In some embodiments, a material of the adhesion layer 106 includes aluminum oxide (e.g. $Al_2O_3$). In some embodiments, the adhesion layer 106 is formed on the channel layer 104 and between the channel layer 104 and the subsequently formed composite hafnium-containing dielectric layer to enhance the adhesion of both layers and avoid peeling therebetween. In one embodiment, through the formation of the adhesion layer 106 formed on the channel layer 104, the subsequently formed composite hafnium-containing dielectric layer can be successfully and well formed over the 2D material the channel layer 104.

The adhesion layer 106 may be formed by using the methods of pulse laser deposition (PLD), CVD, plasma-enhanced atomic layer deposition (PEALD), ALD (atomic layer deposition), E-gun evaporation (E-gun), or the like. In some embodiments, the adhesion layer 106 has a thickness ranging from about 0.5 nm to 1.5 nm, or from about 0.5 nm to 1.0 nm.

Figure 5:
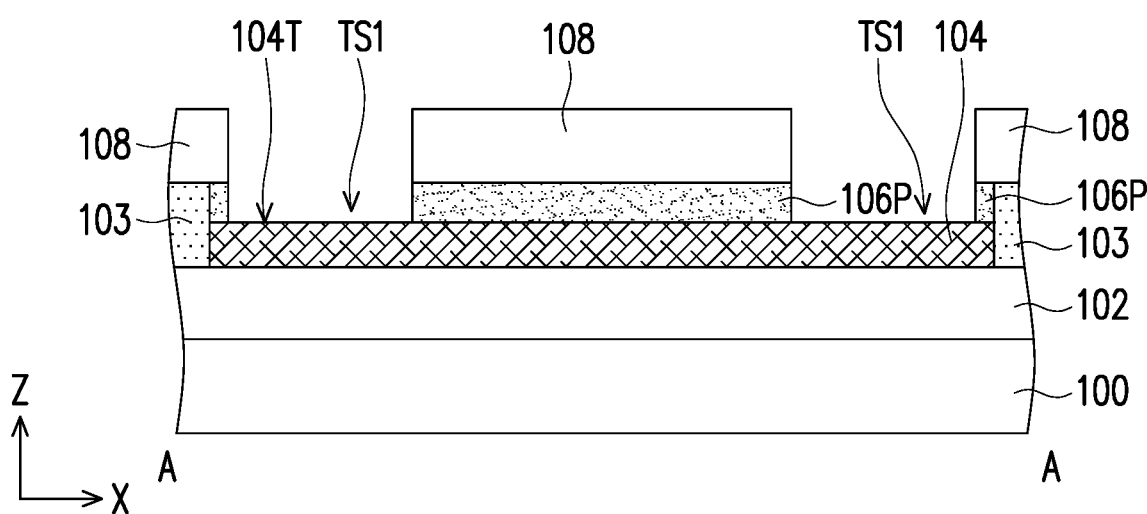
Figure 6:
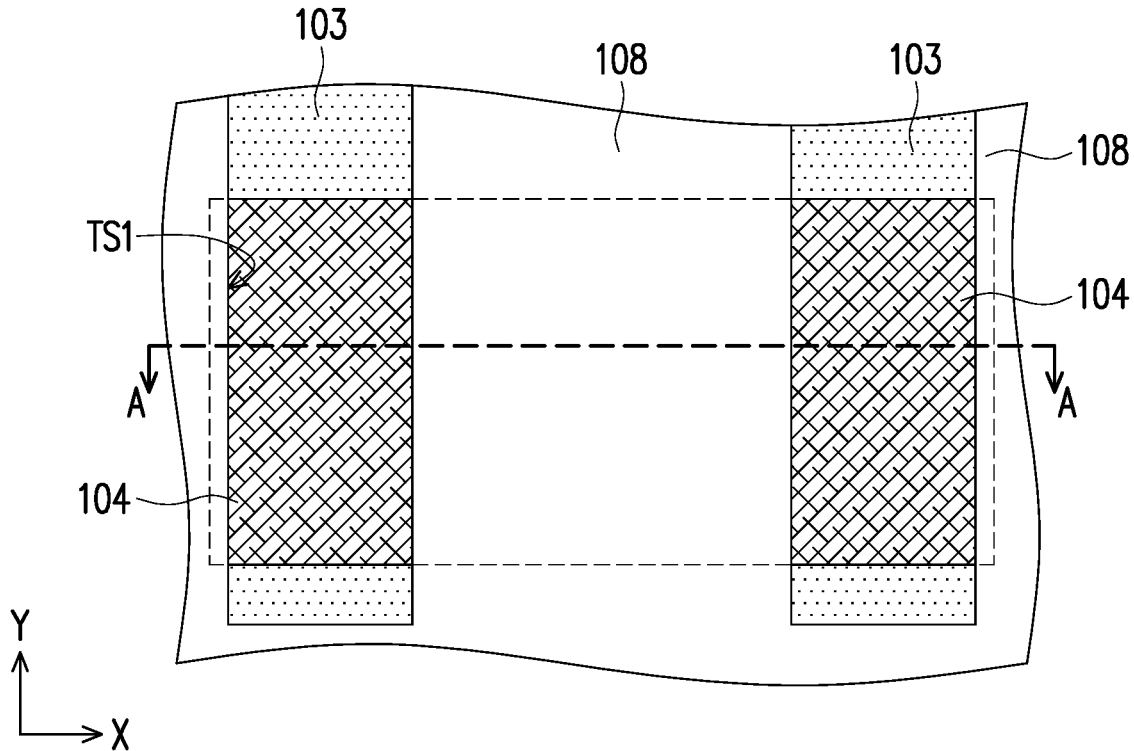

FIG. 5 shows schematic cross-sectional views of a structure shown in FIG. 6 along cross-section line A-A. Referring to FIGS. 5 and 6, in some embodiments, a photoresist pattern 108 with openings is formed over the adhesion layer 106 and the isolation structure(s) 103 to expose portions of the underlying adhesion layer 106 and the isolation structure(s) 103. For example, the locations of the openings of the photoresist pattern 108 correspond to the locations of later formed source and drain terminals.

The formation of the photoresist pattern 108 includes forming a photoresist layer (not shown) over the adhesion layer 106 by spin coating and patterning the photoresist layer through exposure and development to form the photoresist pattern 108. For example, the photoresist pattern is formed with the outlines or shapes defining the later-formed pattern of the adhesion layer 106. Using the photoresist pattern 108 as a mask, an etching process is performed to remove the exposed portions of the adhesion layer 106 to form an adhesion pattern 106P with trenches TS1. In some embodiments, through the etching process, portions of the adhesion layer 106 that are exposed by the openings of the photoresist pattern 108 are removed until the underlying channel layer 104 is exposed (a top surface 104T of the channel layer 104 is exposed from the trenches TS1). In some embodiments, the etching process is performed to remove the exposed adhesion layer while the isolation structure(s) 103 is not etched or little etched. Later, the photoresist pattern 108 is removed.

In some embodiments, the etching process includes performing one or more anisotropic etching process(es), isotropic etching process(es) or a combination thereof. In some embodiments, the etching process may include performing a reactive ion etching (RIE) process or an atomic layer etching (ALE) process. In some embodiments, the etching process may include performing a reactive gas-assisted etching process or a metal-assisted chemical etching process. In some embodiments, the etching process may include performing a laser etching process and/or a thermal annealing process.

Figure 7:
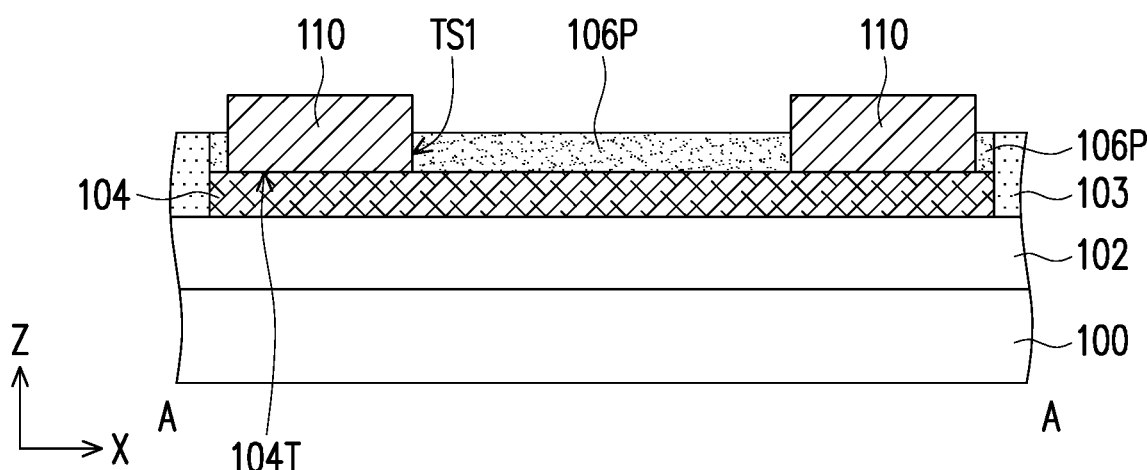
Figure 8:
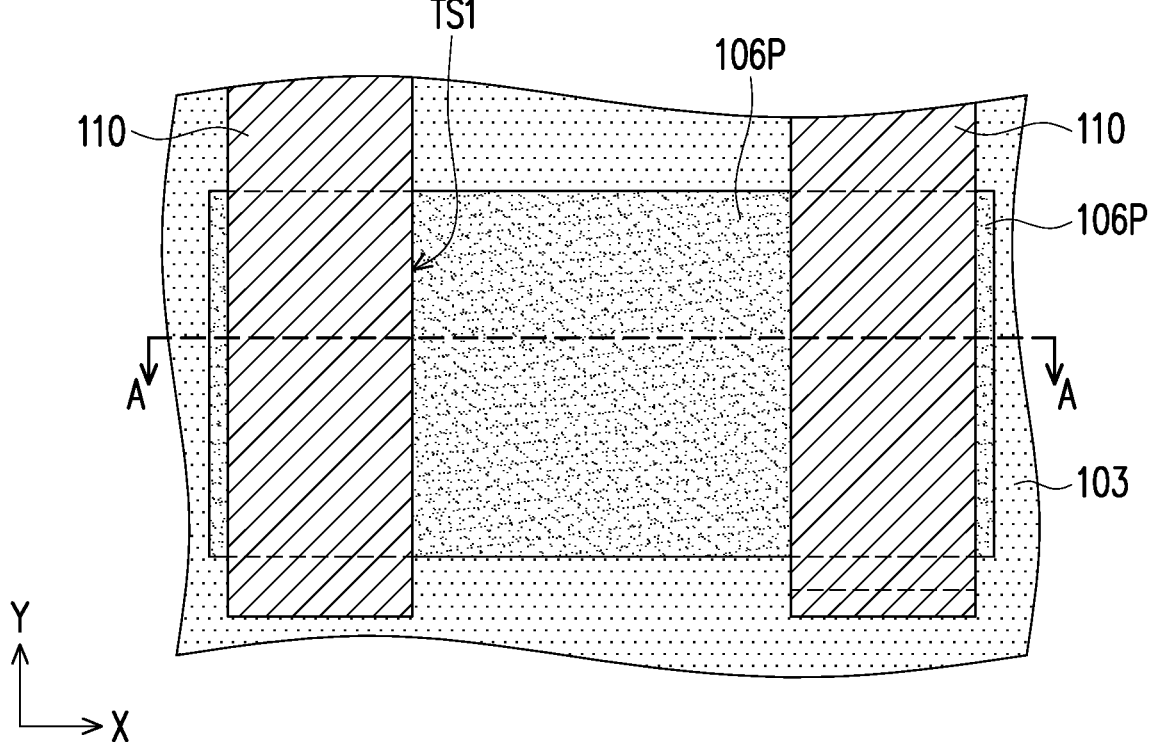

FIG. 7 shows schematic cross-sectional views of a structure shown in FIG. 8 along cross-section line A-A. Referring to FIGS. 5, 6, 7 and 8, in some embodiments, source and drain terminals 110 are formed inside the trenches TS1 of the adhesion pattern 106P and formed directly on the top surface 104T of the channel layer 104 exposed by the trenches TS1. From the schematic top view of FIG. 8, the source and drain terminals 110 each individually is strip-shaped and intersects with the strip shaped pattern of the channel layer 104 and partially overlaps with the channel layer 104. In some embodiments, from the schematic top view of FIG. 8, the source and drain terminals 110 located directly on the channel layer 104 extend through the trenches TS1 of the adhesion pattern 106P and are in contact with inner sidewalls the trenches TS1 of the adhesion pattern 106P. That is, the source and drain terminals 110 physically and directly contact the channel layer 104. It can be considered as bottom surfaces of the source and drain terminals 110 are in contact with the channel layer 104 (i.e. bottom-contact). In an alternative embodiment, the source and drain terminals 110 is formed over the overlay layer 102 and beside the channel layer 104, so that opposing sidewalls of the source and drain terminals 110 are in contact with the sidewalls of the channel layer 104 (i.e. side-contact). Depending on the pattern shape of the adhesion pattern 106P, the source and drain terminals 110 may be in contact with sidewalls of the adhesion pattern 106P.

In some embodiments, the source and drain terminals 110 are formed by forming a conductive material including a metallic material, a metal material or metal alloys over the photoresist pattern 108 and filling the trenches TS1, and later the extra conductive material is removed. In some embodiments, the source and drain terminals 110 are located directly on the channel layer 104 with the adhesion pattern 106P extending between the source and drain terminals 110. In some embodiments, the source and drain terminals 110 may be formed as strip-shaped and transferred onto the channel layer 104 exposed from the adhesion pattern 106P.

For example, the formation of the conductive material of the source and drain terminals 110 includes forming a metallic material by plating or deposition over the adhesion pattern 106P and the exposed portions of the channel layer 104. It is understood that an optional seed layer or a liner material layer (not shown) may be formed inside the trenches TS1 and covering the top surfaces of the exposed portions of the channel layer 104 before forming the metallic material. In some embodiments, the metallic material includes one or more materials selected from titanium (Ti), chromium (Cr), tungsten (W), scandium (Sc), niobium (Nb), nickel (Ni), palladium (Pd), platinum (Pt), silver (Ag), gold (Au), aluminum (Al), ruthenium (Ru), molybdenum (Mo), tantalum (Ta), alloys thereof, and nitrides thereof, for example. In one embodiment, the metallic material includes gold. In some embodiments, the metallic material is formed by CVD (such as metal organic CVD) or PVD (such as thermal evaporation). In some embodiments, the formation of the metallic material may include performing a plating process, such as electrochemical plating (ECP). In some embodiments, the metallic material includes gold, palladium or titanium formed by metal organic CVD (MOCVD) process(es). In some embodiments, the source and drain terminals 110 have a thickness ranging from about 1 nm to about 30 nm.

Figure 9:
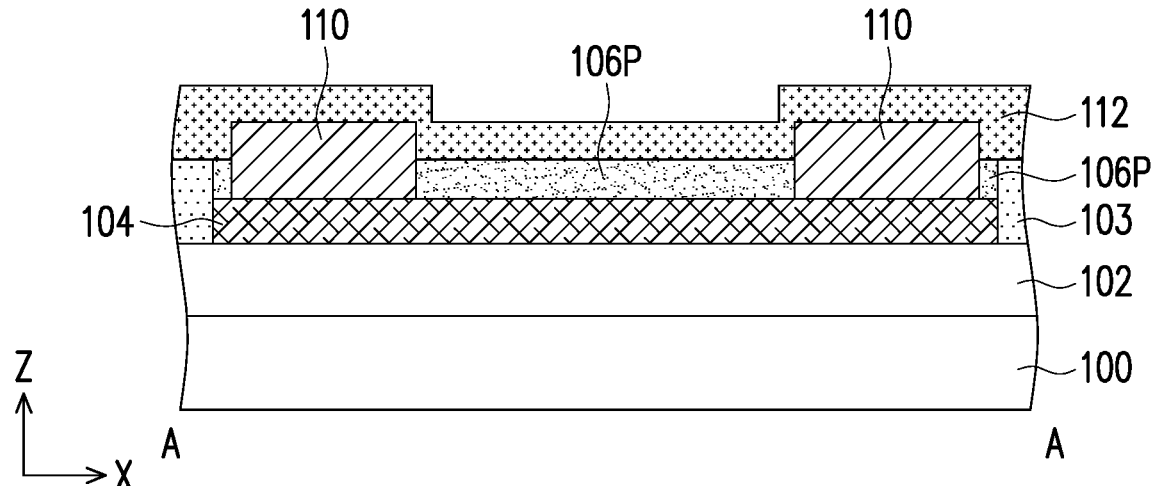

Referring to FIG. 9, in some embodiments, a first hafnium-containing dielectric layer 112 is formed over the substrate 100 covering the adhesion pattern 106P and the source and drain terminals 110. In some embodiments, the source and drain terminals 110 are located between the channel layer 104 and the first hafnium-containing dielectric layer 112 and are sandwiched between the channel layer 104 and the first hafnium-containing dielectric layer 112. In some embodiments, the adhesion pattern 106P is sandwiched between the channel layer 104 and the first hafnium-containing dielectric layer 112. In some embodiments, the first hafnium-containing dielectric layer 112 may partially cover the isolation structure(s) 103.

In some embodiments, the first hafnium-containing dielectric layer 112 conformally covers the adhesion pattern 106P, the source and drain terminals 110, and the isolation structure(s) 103 within the device region. In some embodiments, the first hafnium-containing dielectric layer 112 extends over top surfaces of the source and drain terminals 110, the adhesion pattern 106P and the isolation structure(s) 103, and partially covers sidewalls of the source and drain terminals.

In some embodiments, the material of the first hafnium-containing dielectric layer 112 includes hafnium oxide (e.g. $HfO_2$). For example, the material of the first hafnium-containing dielectric layer 112 has a dielectric constant from about 7 to about 20. In some embodiments, the first hafnium-containing dielectric layer 112 may be formed by a process of CVD such as high-density-plasma chemical vapor deposition (HDP-CVD), sub-atmospheric CVD (SACVD), or atomic layer deposition (ALD). In one embodiment, the first hafnium-containing dielectric layer 112 is formed by ALD. In some embodiments, the first hafnium-containing dielectric layer 112 has a thickness ranging from about 0.5 nm to about 5.0 nm, especially from about 0.5 nm to about 2.0 nm. Alternatively, in some embodiments, the first hafnium-containing dielectric layer 112 is formed to have a minimal thickness achievable by the available fabrication process. For example, the minimal thickness is about 0.5 nm or even less. In some embodiments, a temperature of the fabrication process ranges from about 50° C. to about 250° C., especially from about 50° C. to about 200° C. Compared with other semiconductor manufacturing processes, the temperature for forming the first hafnium-containing dielectric layer 112 is relatively lower such that the crystalline structure of the material of the channel layer 104 may be well maintained without downgrading the performance of the device.

Figure 10:
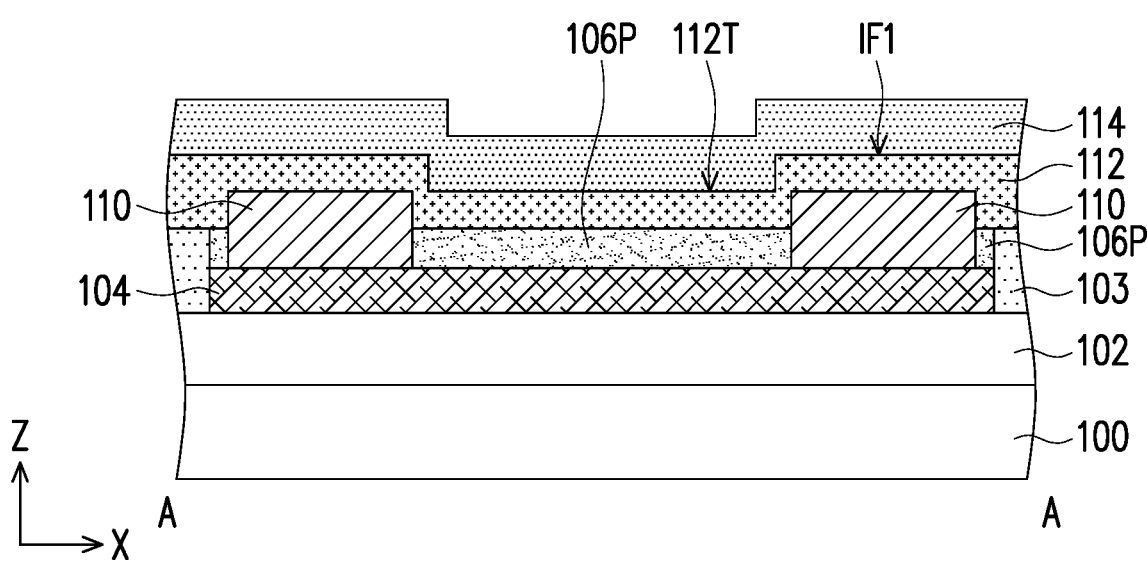
Figure 11:
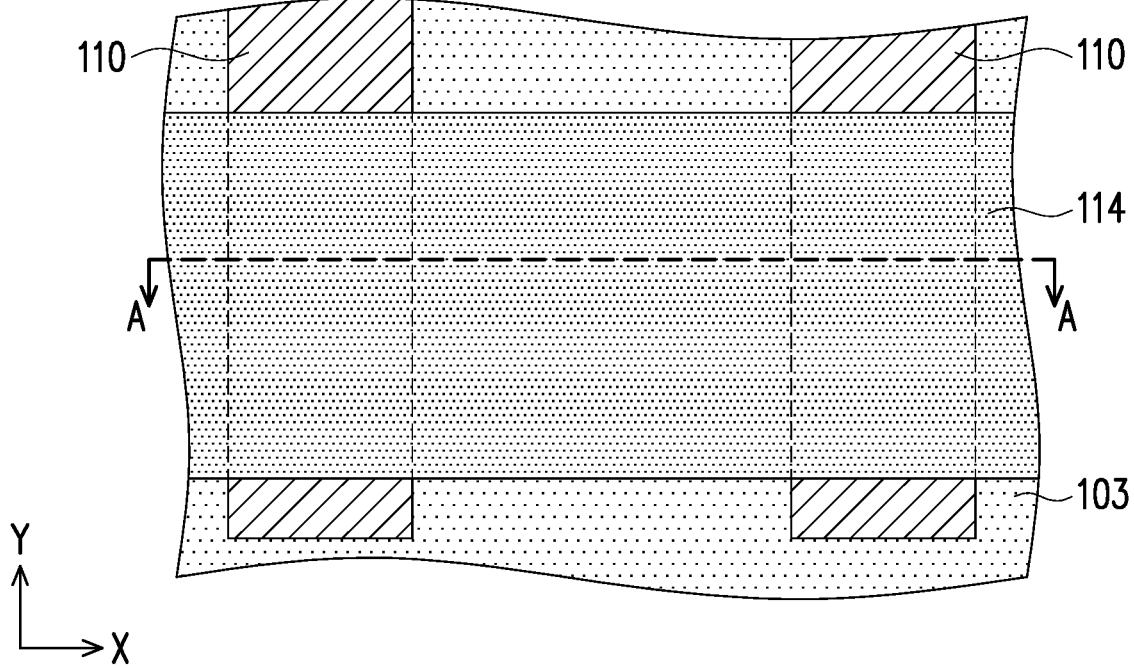

FIG. 10 shows schematic cross-sectional views of a structure shown in FIG. 11 along cross-section line A-A. Referring to FIGS. 10 and 11, in some embodiments, a second hafnium-containing dielectric layer 114 is formed over the first hafnium-containing dielectric layer 112 over the substrate 100. From the schematic top view of FIG. 11, the first hafnium-containing dielectric layer 112 and the second hafnium-containing dielectric layer 114 are formed to have strip shaped patterns, extending over and fully covering the adhesion pattern 106P and extending across and partially covering the source and drain terminals 110. In some embodiments, the second hafnium-containing dielectric layer 114 extends over the top surface 112T of the first hafnium-containing dielectric layer 112. In some embodiments, the second hafnium-containing dielectric layer 114 conformally covers the first hafnium-containing dielectric layer 112.

In some embodiments, the material of the second hafnium-containing dielectric layer 114 includes an oxide material containing hafnium and at least one other metal (e.g. zirconium). In some embodiments, the material of the second hafnium-containing dielectric layer 114 includes hafnium zirconium oxide, denoted as $Hf_xZr_{1-x}O_2$, wherein x is greater than zero and less than about 0.5, or ranges from about 0.1 to about 0.4. In some embodiments, the second hafnium-containing dielectric layer 114 includes hafnium zirconium oxide, denoted as $Hf_xZr_{1-x}O_2$, wherein x ranges from about 0.3 to about 0.35. In some embodiments, the second hafnium-containing dielectric layer 114 includes hafnium zirconium oxide having a zirconium/hafnium atomic ratio ranging from 1.8 to 2.4. When x is greater than zero and less than about 0.5 for $Hf_xZr_{1-x}O_2$, the hafnium zirconium oxide has anti-ferroelectricity and a high dielectric constant, and such material is a high-k dielectric material. In some embodiments, the material of the second hafnium-containing dielectric layer 114 has a dielectric constant greater than about 20 and less than or about 40. In some embodiments, the material of the second hafnium-containing dielectric layer 114 has a dielectric constant greater than about 30 and less than or about 40.

For example, the second hafnium-containing dielectric layer 114 may be formed by a process of CVD such as HDP-CVD, SACVD, or ALD. In one embodiment, the second hafnium-containing dielectric layer 114 may be formed by ALD using suitable precursors such as TEMAH (tetrakis (dimethylamino) hafnium) and TEMAZ (tetrakis (ethylmethylamido) zirconium). In some embodiments, the second hafnium-containing dielectric layer 114 is formed by forming hafnium zirconium oxide ($Hf_xZr_{1-x}O_2$) with a nano-laminar structure by alternating ALD reaction cycles of hafnium oxide and zirconium oxide at about 200° C.~250° C. In some embodiments, the second hafnium-containing dielectric layer 114 has a thickness ranging from about 0.5 nm to about 5.0 nm, especially from about 1.5 nm to about 4.0 nm. In some embodiments, the thickness of the second hafnium-containing dielectric layer 114 is equal to or greater than the thickness of the first hafnium-containing dielectric layer 112. In some embodiments, a thickness ratio of the second hafnium-containing dielectric layer 114 to the first hafnium-containing dielectric layer 112 is from about 1:1 to about 10:1. In some embodiments, a thickness ratio of the second hafnium-containing dielectric layer 114 to the first hafnium-containing dielectric layer 112 is from about 1.4:1 to about 5:1. In some embodiments, a temperature of the process is from about 50° C. to about 250° C., especially from about 50° C. to about 200° C. Similarly, the temperature for forming the second hafnium-containing dielectric layer 114 is relatively lower to maintain the crystalline structure of the material of the channel layer 104 for better performance of the device. In some embodiments, the reaction temperature for forming the second hafnium-containing dielectric layer 114 is slightly higher than that of the first hafnium-containing dielectric layer 112.

In some embodiments, the second hafnium-containing dielectric layer 114 has a hafnium content lower than that of the first hafnium-containing dielectric layer 112, and there is a clear interface IF1 between the second hafnium-containing dielectric layer 114 and the first hafnium-containing dielectric layer 112. In some embodiments, as the second hafnium-containing dielectric layer 114 has a dielectric constant higher than that of the first hafnium-containing dielectric layer 112, the existence of the second hafnium-containing dielectric layer 114 (offering higher-k) can further reduce the total thickness of the composite stack of the first and second hafnium-containing dielectric layers 112, 114 by decreasing the thickness of the first hafnium-containing dielectric layer 112. Hence, the equivalent oxide thickness (EOT) of the transistor structure is significantly reduced by 30%, while low leakage current (a very low gate leakage current density) is offered.

Figure 12:
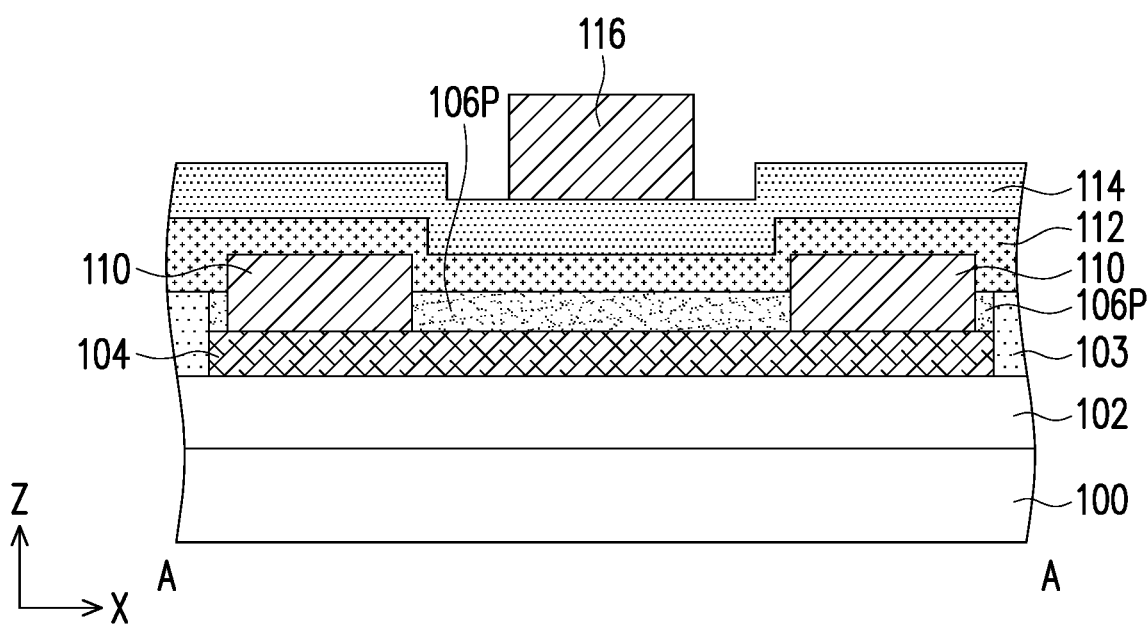
Figure 13:
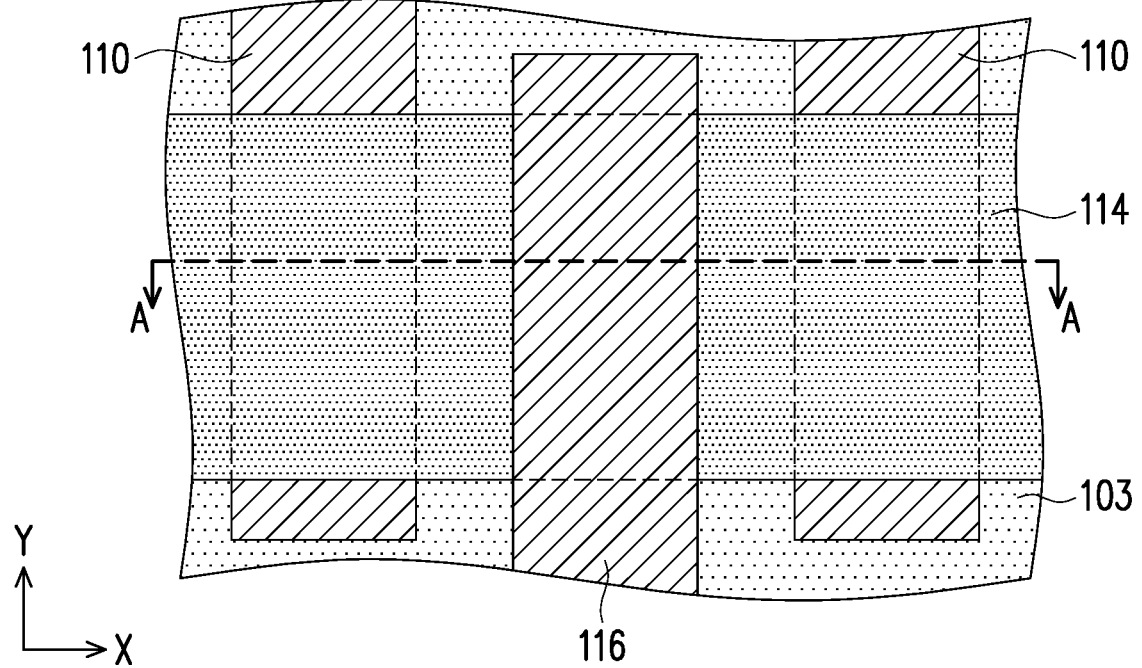

FIG. 12 shows schematic cross-sectional views of a structure shown in FIG. 13 along cross-section line A-A. Referring to FIGS. 12 and 13, in some embodiments, after the second hafnium-containing dielectric layer 114 is formed, a gate structure 116 is formed on the second hafnium-containing dielectric layer 114 and between the source and drain terminals 110.

From the schematic top view of FIG. 13, the source and drain terminals 110 are located beside and located by two opposite sides of the gate structure 116. In some embodiments, the source and drain terminals 110 individually intersect the adhesion pattern 106P and partially cover the underlying strip shaped channel layer 104, and the gate structure 116 extends across and partially covers the strip shaped first and second hafnium-containing dielectric layers

112, 114. It is understood that the gate structure may be shown to be strip-shaped but the shape of the gate structure may be varied and the pattern of the gate structure may be separated into multiple sections based on the layout requirement of the device.

In some embodiments, the gate structure 116 is located above an active channel region (the region of the channel layer 104 between the source and drain terminals). In some embodiments, the gate structure 116 may be formed by blanketly forming a metallic material layer (not shown) and then patterning the metallic material layer into the strip shaped gate structure. In some embodiments, the gate structure 116 has a thickness ranging from about 1 nm to about 30 nm.

In some embodiments, the material of the gate structure 116 includes one or more materials selected from titanium (Ti), chromium (Cr), tungsten (W), scandium (Sc), niobium (Nb), nickel (Ni), palladium (Pd), platinum (Pt), silver (Ag), gold (Au), aluminum (Al), ruthenium (Ru), molybdenum (Mo), tantalum (Ta), alloys thereof, and nitrides thereof, for example. In some embodiments, the metallic material includes gold or titanium nitride.

Moreover, the gate structure may further include a liner layer, an interfacial layer, a work function layer, or a combination thereof. In some alternative embodiments, a seed layer, a barrier layer, or a combination thereof may also be included between the gate structure 116 and the channel layer 104. In some embodiments, the gate structure 116 is formed by CVD (such as MOCVD) or PVD (such as thermal evaporation). In some embodiments, the formation of the gate structure 116 may include performing a plating process (such as ECP).

Figure 14:
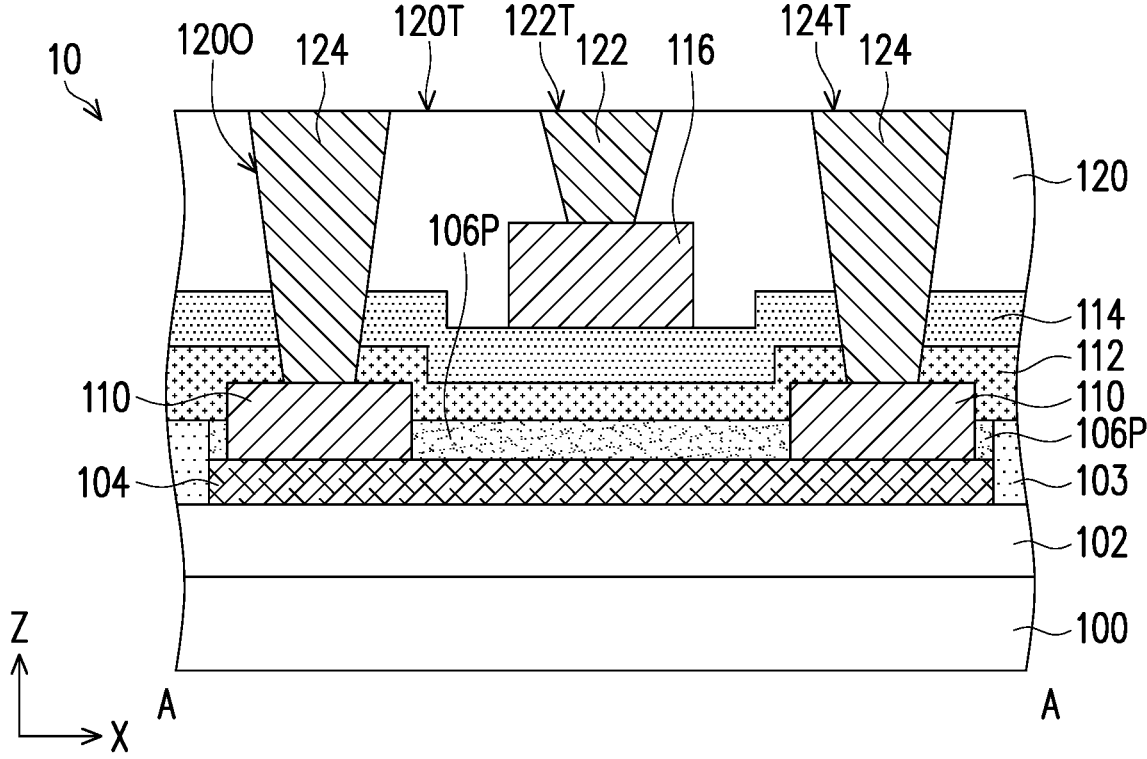

Referring to FIG. 14, an interlayer dielectric (ILD) layer 120 is formed over the substrate 100 covering the gate structure 116 and the second hafnium-containing dielectric layer 114. Later, contacts 122 and 124 are formed in the ILD layer 120. In some embodiments, the contact 122 extends from the top surface 120T of the ILD layer 120 to directly contact the gate structure 116, and the contacts 124 extend through the ILD layer 120 and the first and second hafnium-containing dielectric layers 112, 114 to directly contact the source and drain terminals 110 respectively.

In some embodiments, the ILD layer 120 is blanketly formed over the substrate 100 and the overlay layer 102 and covers the gate structure 116, the first hafnium-containing dielectric layer 112, the second hafnium-containing dielectric layer 114, the source and drain terminals 110, the adhesion pattern 106P, the channel layer 104, and the isolation structure(s) 103. In some embodiments, a material of the ILD layer 120 includes silicon oxide, silicon nitride, or one or more low-k dielectric materials. Examples of low-k dielectric materials include silicate glass such as phospho-silicate-glass (PSG) and boro-phospho-silicate-glass (BPSG), BLACK DIAMOND®, SILK®, hydrogen silsesquioxane (HSQ), fluorinated silicon oxide (SiOF), amorphous fluorinated carbon, parylene, BCB (bis-benzo-cyclobutene), flare, or a combination thereof. It is understood that the ILD layer 120 may include one or more dielectric materials or one or more dielectric layers. In some embodiments, the ILD layer 120 is formed to a suitable thickness by flowable CVD (FCVD), PECVD, HDPCVD, SACVD, spin-on coating, or other suitable methods. For example, an interlayer dielectric material layer (not shown) may be formed by PECVD and an etching or polishing process may be performed to reduce the thickness of the interlayer dielectric material layer until a desirable thickness to form the ILD layer 120.

Referring to FIG. 14, after forming the ILD layer 120, the contacts 124 and 122 are formed, then a transistor device 10 (e.g. FET device) is formed. In some embodiments, the contacts 124 are formed in the ILD layer 120 at locations right above the source and drain terminals 110, and the contact 122 (only one is shown) is formed in the ILD layer 120 at the location right above the gate structure 116. In some embodiments, the contacts 124 and 122 directly contact and are connected to the source and drain terminals 110 and the gate structure 116 respectively.

In some embodiments, the formation of the contacts 124 and 122 includes forming a patterned mask layer (not shown) over the ILD layer 120, dry etching the ILD layer using the patterned mask layer as a mask to form contact openings 120O exposing the source and drain terminals 110 and the gate structure 116. As seen in FIG. 14, the contact openings 120O are shown with slant sidewalls. It is understood that the contact openings may be formed with substantially vertical sidewalls if feasible, and the number of the contact openings 120O is merely exemplary but not intended for limiting the scope of this disclosure. In some embodiments, the ILD layer 120 may further include an etch stop layer (not shown) therein for assisting the formation of the contact openings. Thereafter, a metallic material is deposited and filled into the contact openings to form the contacts 124 and 122. The metallic material includes Al, copper (Cu), W, cobalt (Co), alloys thereof or nitrides thereof, for example. In one embodiment, the metallic material is formed by performing a CVD process, plating or a PVD process. Optionally, the extra metallic material may be removed by performing a planarization process, an etching process, or other suitable processes. In some embodiments, the planarization process may include performing a CMP process. As seen in FIG. 14, the top surface 120T of the ILD layer 120 is substantially flush with and levelled with top surfaces 124T and 122T of the contacts 124 and 122.

In some embodiments, the channel layer 104 in direct contact with the source and drain terminals 110 functions as a channel region of the transistor structure 10, and the source and drain terminals 110 are electrically connected with the channel region (channel layer 104) of the transistor structure 10. In some embodiments, the first hafnium-containing dielectric layer 112 and the second hafnium-containing dielectric layer 114 that are located between the gate structure 116, the channel layer 104 and the source and drain terminals 110 together function as the composite gate dielectric layer of the transistor structure 10. In some embodiments, the transistor structure 10 includes contacts 124 and 122 respectively in contact with the source and drain terminals 110 and the gate structure 116. In some embodiments, the transistor structure 10 is a top-gate transistor structure.

In the illustrated embodiments, the described methods and structures may be formed compatible with the current semiconductor manufacturing processes. In exemplary embodiments, the described methods and structures are formed during front-end-of-line (FEOL) processes. In one embodiment, the transistor device 10 is a logic device. In some embodiments, the material of the channel layer 104 includes TMD and the transistor device 10 is a TMD-based field-effect transistor (TMD-FET).

The illustrated structure of transistor device 10 may be a portion of integrated circuits. In some embodiments, the illustrated structure may include active devices such as thin film transistors, high voltage transistors, passive components, such as resistors, capacitors, inductors, fuses, and/or other suitable components. In some embodiments, additional steps may be provided before, during, and after the process steps depicted from FIG. 1 to FIG. 14, and some of the steps described above may be replaced or eliminated, for additional embodiments of the method.

Figure 15:
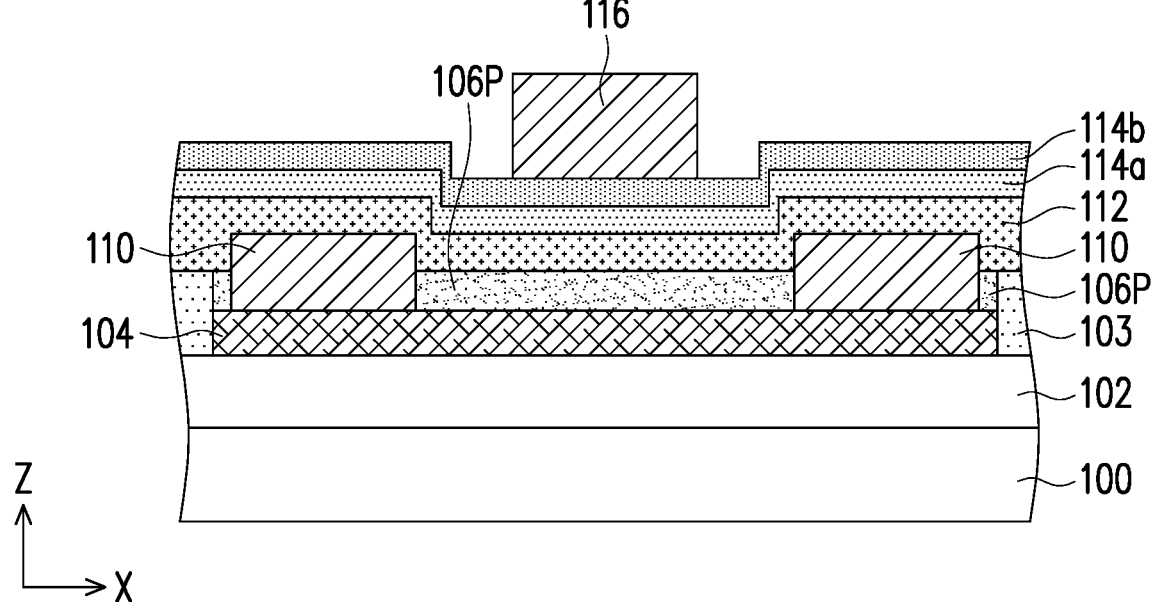
FIG. 15 is schematic cross-sectional view showing a semiconductor device in accordance with some embodiments of the disclosure.

FIG. 15 is schematic cross-sectional view showing a semiconductor device in accordance with some embodiments of the disclosure. The exemplary structures shown in FIG. 15 may be fabricated following the process steps as described in the previous embodiments as shown from FIG. 1 to FIG. 14, and similar materials may be used as described in the previous embodiments may be used. However, it is understood that any other compatible process steps or methods or any other suitable materials may be utilized and comprehensible modifications or adjustments may be made for forming the exemplary structure of this disclosure.

Referring to FIG. 15, a lower hafnium-containing dielectric layer 114a is formed over and conformally covers the first hafnium-containing dielectric layer 112, and an upper hafnium-containing dielectric layer 114b is formed over and conformally covers the lower hafnium-containing dielectric layer 114a. In some embodiments, the formation methods and the material(s) of the first hafnium-containing dielectric layer 112 are substantially the same with or similar to the first hafnium-containing dielectric layer 112 as described in previous paragraphs. In some embodiments, the hafnium-containing dielectric layer 114a and the hafnium-containing dielectric layer 114b are formed by similar methods or process steps for forming the second hafnium-containing dielectric layer 114 as described in previous paragraphs. In some embodiments, the stack of the hafnium-containing dielectric layer 114a and the hafnium-containing dielectric layer 114b has a thickness ranging from about 0.5 nm to about 5.0 nm, especially from about 1.5 nm to about 4 nm. In some embodiments, the hafnium-containing dielectric layer 114a has a thickness ranging from about 0.5 nm to about 2.5 nm, especially from about 1.0 nm to about 2.0 nm. In some embodiments, the hafnium-containing dielectric layer 114b has a thickness ranging from about 0.5 nm to about 2.5 nm, especially from about 1.0 nm to about 2.0 nm. In some embodiments, a thickness ratio of the stack (the stack of the hafnium-containing dielectric layer 114a and the hafnium-containing dielectric layer 114b) to the first hafnium-containing dielectric layer 112 is from about 1:1 to about 10:1.

In some embodiments, a material of the hafnium-containing dielectric layer 114a or 114b includes hafnium zirconium oxide, denoted as $Hf_xZr_{1-x}O_2$, wherein x is greater than zero and less than about 0.5, or ranges from about 0.1 to about 0.4. In some embodiments, a material of the hafnium-containing dielectric layer 114a or 114b includes hafnium zirconium oxide, denoted as $Hf_xZr_{1-x}O_2$, wherein x ranges from about 0.3 to about 0.35. In some embodiments, the first hafnium-containing dielectric layer 112 includes hafnium oxide, the hafnium-containing dielectric layers 114a and 114b include hafnium zirconium oxide, the first hafnium-containing dielectric layer 112 has a hafnium content higher than those of both hafnium-containing dielectric layers 114a and 114b, and either the hafnium-containing dielectric layer 114a or 114b has a zirconium content higher than that of the first hafnium-containing dielectric layer 112. In one embodiment, the zirconium content of hafnium zirconium oxide ($Hf_xZr_{1-x}O_2$) of the hafnium-containing dielectric layer 114a is different from the zirconium content of the zirconium content of the hafnium-containing dielectric layer 114b. In certain embodiments, the hafnium-containing dielectric layer 114a has a zirconium content lower than that of the hafnium-containing dielectric layer 114b, and a hafnium content higher than that of the hafnium-containing dielectric layer 114b.

In some alternative embodiments, more than one hafnium and zirconium-containing dielectric layer(s) may be formed conformally covering the first hafnium-containing dielectric layer 112. The additional hafnium and zirconium-containing dielectric layer(s) may have a higher dielectric constant (relative to the hafnium oxide layer free of zirconium) and leads to smaller total thickness and lower EOT. The number of the additional hafnium and zirconium-containing dielectric layer(s) is not limited and may be two, three or more.

FIG. 16 to FIG. 21 are schematic top views and sectional views showing various stages in a method of manufacturing a semiconductor device in accordance with some embodiments of the present disclosure.

Figure 16:
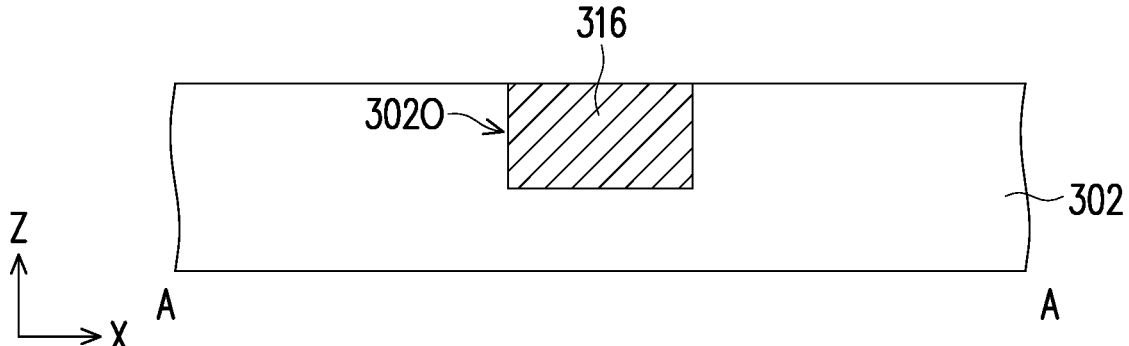
FIG. 16 to FIG. 21 are schematic top views and sectional views showing various stages in a method of manufacturing a semiconductor device in accordance with some embodiments of the present disclosure.
Figure 17:
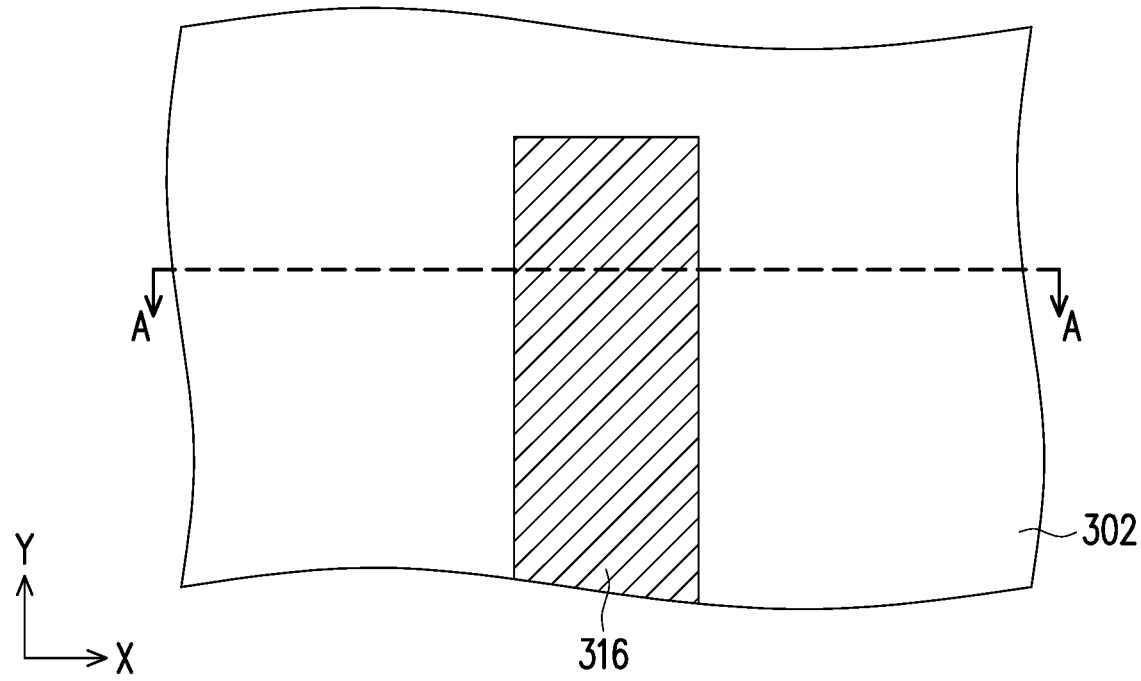

Referring to FIGS. 16 and 17, in some embodiments, a gate structure 316 is formed in an opening 302O of a first dielectric layer 302 (e.g., an inter-layer dielectric layer of an interconnect structure).

FIG. 16 shows schematic cross-sectional views of a structure shown in FIG. 17 along cross-section line A-A. From the top view of FIG. 17, a strip shaped pattern of the gate structure 116 over the first dielectric layer 302 extends along a direction X of a X-Y plane.

The first dielectric layer 302 is disposed over a substrate (not shown). The first dielectric layer 302 may include, but is not limited to, silicon dioxide, silicon nitride, silicon oxynitride. A removal process or a patterning process is performed on the first dielectric layer 302 to remove a portion of the first dielectric layer 302 thereby the opening 302O (e.g., a cavity) is formed in the first dielectric layer 302. In some embodiments, a photoresist (not shown) is formed over the first dielectric layer 302. The photoresist may then be patterned using photolithography techniques to generate an opening in the photoresist. The patterned photoresist may then be used as a mask for patterning the first dielectric layer 302. In this regard, an anisotropic etch process may be performed to remove a region of the first dielectric layer 302 to form the opening 302O in the region of the first dielectric layer 302. After performing the removal process (e.g., an anisotropic etch process), any residual photoresist is removed by an ash process or by dissolution with a solvent.

A conductive material layer (not shown) is deposited on the first dielectric layer 302 such that the opening 302O defined in the first dielectric layer 302 is filled with the conductive material layer. The conductive material layer not only fills the opening 302O defined in the first dielectric layer 302, but also covers a top surface of the first dielectric layer 302. The conductive material layer may include a metallic liner material and/or a metallic fill material. The metallic liner material may include a metal or a metal alloy, or metal nitride. For example, in some embodiments, the material of the conductive material layer includes Ti. Pt, Pd, Au, W, Ag, Ni, Al, TiN, tantalum nitride (TaN), tungsten nitride (WN), or combinations thereof. Other suitable metallic liner and metallic fill materials within the contemplated scope of this disclosure may also be used. The metallic liner material and metallic fill materials may be formed by suitable deposition process, which may include one or more of a CVD (such as MOCVD) process, a PVD process, plating process (such as ECP), etc. Other suitable deposition processes are within the contemplated scope of disclosure.

A removal process (e.g., a planarization process) is performed to remove excess portions of the conductive material layer until the top surface of the first dielectric layer 302 is revealed such that the gate structure 316 is formed in the opening 302O.

The gate structure 316 is embedded in the defined in the first dielectric layer 302, and a top surface of the gate structure 316 substantially levels with the top surface of the first dielectric layer 302. The gate structure 316 has a thickness ranging from about 5 nm to about 50 nm, or about 20 nm to about 40 nm, although other embodiments may include smaller and larger thicknesses. In some alternative embodiments, a seed layer, a barrier layer, or a combination thereof may also be included between the gate structure 316 and the first dielectric layer 302.

Figure 18:
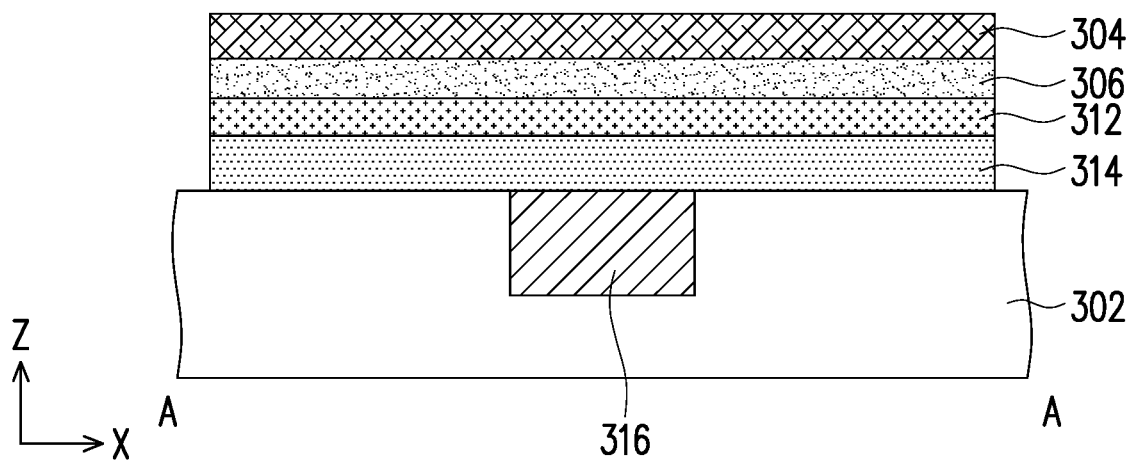
Figure 19:
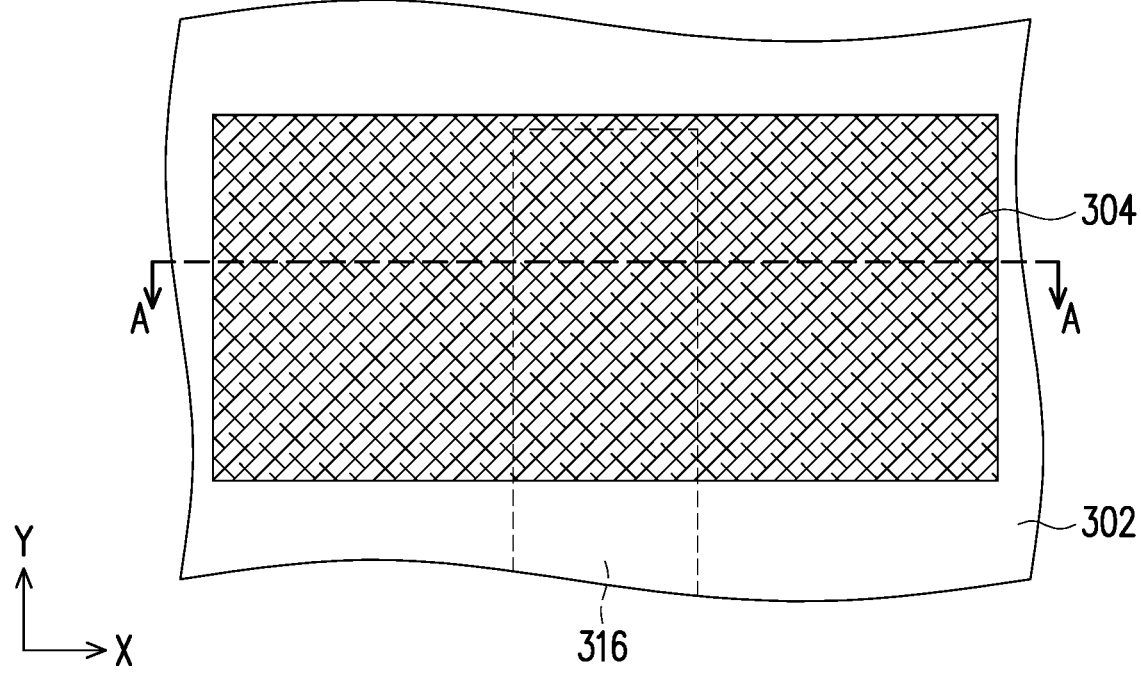

Referring to FIGS. 18 and 19, in some embodiments, a second hafnium-containing dielectric layer 314 is formed on the gate structure 316 and the first dielectric layer 302, a first hafnium-containing dielectric layer 312 is formed on the second hafnium-containing dielectric layer 314, an adhesion layer 306 is formed on the first hafnium-containing dielectric layer 312, and a channel layer 304 is formed on the adhesion layer 306.

FIG. 18 shows schematic cross-sectional views of a structure shown in FIG. 19 along cross-section line A-A. From the top view of FIG. 19, the second hafnium-containing dielectric layer 314 the first hafnium-containing dielectric layer 312, an adhesion layer 306 and the channel layer 304 extend over the strip shaped pattern of the gate structure 316 and the first dielectric layer 302.

In some embodiments, each one of the second hafnium-containing dielectric layer 314, the first hafnium-containing dielectric layer 312, the adhesion layer 306 and the channel layer 304 (shown in FIG. 18) is formed by a same process or a different process, to form a stack.

In some embodiments, the second hafnium-containing dielectric layer 314 is formed on a top surface of the gate structure 316 and a top surface of first dielectric layer 302. In some embodiments, a material of the second hafnium-containing dielectric layer 314 includes an oxide material including hafnium and at least one other metal (e.g. zirconium). In some embodiments, the material of the second hafnium-containing dielectric layer 314 includes hafnium zirconium oxide, denoted as $Hf_xZr_{1-x}O_2$, wherein x is greater than zero and less than about 0.5, or ranges from about 0.1 to about 0.4. In some embodiments, the second hafnium-containing dielectric layer 314 includes hafnium zirconium oxide, denoted as $Hf_xZr_{1-x}O_2$, wherein x ranges from about 0.3 to about 0.35. In some embodiments, the second hafnium-containing dielectric layer 314 includes hafnium zirconium oxide having a zirconium/hafnium atomic ratio ranging from 1.8 to 2.4. When x is greater than zero and less than about 0.5 for $Hf_xZr_{1-x}O_2$, the hafnium zirconium oxide has anti-ferroelectricity and a high dielectric constant, and such material is a high-k dielectric material. In some embodiments, the material of the second hafnium-containing dielectric layer 314 has a dielectric constant greater than about 20 and less than or about 40. In some embodiments, the material of the second hafnium-containing dielectric layer 314 has a dielectric constant greater than about 30 and less than or about 40. For example, the second hafnium-containing dielectric layer 314 may be formed by a process of CVD such as HDP-CVD, SACVD, or ALD. In one embodiment, the second hafnium-containing dielectric layer 314 may be formed by ALD using suitable precursors such as TEMAH (tetrakis (dimethylamino) hafnium) and TEMAZ (tetrakis (ethylmethylamido) zirconium). In some embodiments, the second hafnium-containing dielectric layer 314 is formed by forming hafnium zirconium oxide ($Hf_xZr_{1-x}O_2$) with a nanolaminar structure by alternating ALD reaction cycles of hafnium oxide and zirconium oxide at about 200° C.~250° C. In some embodiments, the second hafnium-containing dielectric layer 314 has a thickness ranging from about 0.5 nm to about 5.0 nm, especially from about 1.5 nm to about 4.0 nm. In some embodiments, a temperature of the process is about 50° C. to about 250° C., especially about 50° C. to about 200° C.

In some alternative embodiments, more than one hafnium and zirconium-containing dielectric layer(s) may be formed conformally covering the first dielectric layer 302. The additional hafnium and zirconium-containing dielectric layer(s) may have a higher dielectric constant (relative to the hafnium oxide layer free of zirconium) and leads to smaller total thickness and lower EOT. The number of the additional hafnium and zirconium-containing dielectric layer(s) is not limited and may be two, three or more. Properties and materials of the additional hafnium and zirconium-containing dielectric layer(s) are similar properties and materials of the hafnium-containing dielectric layer 114a, 114b. The additional hafnium and zirconium-containing dielectric layer(s) are formed by similar methods or process steps for forming the second hafnium-containing dielectric layer 114 as described in previous paragraphs layer(s).

In some embodiments, the first hafnium-containing dielectric layer 312 is formed on a top surface of the second hafnium-containing dielectric layer 314. In some embodiments, a material of the first hafnium-containing dielectric layer 312 includes an oxide material such as hafnium oxide (e.g. $HfO_2$). A dielectric constant of the first hafnium-containing dielectric layer 312 has a dielectric constant from about 7 to about 20. In some embodiments, the first hafnium-containing dielectric layer 312 is formed by ALD. In some embodiments, the first hafnium-containing dielectric layer 312 is formed to have a minimal thickness achievable by the available fabrication process. For example, the minimal thickness is about 0.5 nm or even less. In some embodiments, a temperature of the fabrication process is from about 50° C. to about 250° C., especially from about 50° C. to about 200° C. In some embodiments, the reaction temperature for forming the second hafnium-containing dielectric layer 314 is slightly higher than that of the first hafnium-containing dielectric layer 312.

In some embodiments, a thickness of the second hafnium-containing dielectric layer 314 is equal to or greater than a thickness of the first hafnium-containing dielectric layer 312. In some embodiments, a thickness ratio of the second hafnium-containing dielectric layer 314 to the first hafnium-containing dielectric layer 312 is from about 1:1 to about 10:1. In some embodiments, a thickness ratio of the second hafnium-containing dielectric layer 314 to the first hafnium-containing dielectric layer 312 is from about 1.4:1 to about 5:1.

In some embodiments, the second hafnium-containing dielectric layer 314 has a hafnium content lower than that of the first hafnium-containing dielectric layer 312, and there is a clear interface between the second hafnium-containing dielectric layer 314 and the first hafnium-containing dielectric layer 312. In some embodiments, as the second hafnium-containing dielectric layer 314 has a dielectric constant higher than that of the first hafnium-containing dielectric layer 312, the existence of the second hafnium-containing dielectric layer 314 (offering higher-k) can further reduce the total thickness of the composite stack of the first and second hafnium-containing dielectric layers 312, 314 by decreasing the thickness of the first hafnium-containing dielectric layer 312. Hence, the equivalent oxide thickness (EOT) of the transistor structure is significantly reduced by 30%, while low leakage current (a very low gate leakage current density) is offered.

In some embodiments, the adhesion layer 306 is formed on a top surface of the first hafnium-containing dielectric layer 312. In some embodiments, the adhesion layer 306 includes a material of aluminum oxide (e.g. $Al_2O_3$). In some embodiments, the adhesion layer 306 is formed on the first hafnium-containing dielectric layer 312 and between the channel layer 304 and a composite hafnium-containing dielectric layer (e.g. a stack of the first hafnium-containing dielectric layer 312 and the second hafnium-containing dielectric layer 314) to enhance the adhesion of both layers and avoid peeling therebetween.

The formation of the adhesion layer 306 involves the methods of pulse laser deposition (PLD), CVD, plasma-enhanced atomic layer deposition (PEALD), ALD (atomic layer deposition), E-gun evaporation (E-gun), or the like. The adhesion layer 306 has a thickness ranging from about 0.5 nm to 1.5 nm, or from about 0.5 nm to 1.0 nm.

In some embodiments, the channel layer 304 is formed on a top surface of the adhesion layer 306. In some embodiments, the channel layer 304 is formed and transferred to the adhesion layer 306 by a transfer carrier (not shown). The formation of the channel layer 304 involves the methods of pulse laser deposition (PLD), CVD, plasma-enhanced atomic layer deposition (PEALD), solution based chemical synthesis and/or mechanical or liquid exfoliation. In some embodiments, an annealing process is also performed.

Alternatively, in some embodiments, the channel layer 304 may be formed through a growth process over the adhesion layer 306. The growth process utilizing patterned nucleation seeds is a well-controlled process and may be performed on-site (at the same location). In some embodiments, the growth process includes a CVD process. The CVD process may include a process performed by, for example, electron cyclotron resonance CVD (ECR-CVD), microwave plasma CVD, plasma enhanced CVD (PECVD), low-pressure CVD (LPCVD), thermal CVD or hot filament CVD. In other embodiments, the growth process is a physical vapor deposition (PVD) process. Compared with the transferring formation method, the growth process is well applicable for high density or fine pitch integrated circuitry.

In one embodiment, the channel layer 304 is provided and disposed on the adhesion layer 306 at a predetermined location within a device region. Then the channel layer 304 is transferred onto the adhesion layer 306. In some embodiments, the channel layer 304 has a thickness of from about 0.3 nm to about 5.0 nm, or from about 0.7 nm to about 1.0 nm.

In some embodiments, a material of the channel layer 304 is or includes a low-dimensional material. For example, the low-dimensional materials include nanoparticles, one-dimensional (1D) materials (e.g. carbon nanotubes (CNT) or nanowires and two-dimensional (2D) materials including graphene, hexagonal boron nitride (h-BN), black phosphorus and transition metal dichalcogenides (TMDs). Among the 2D materials, different types of 2D materials may be classified based on their behaviors as semiconducting 2D materials (e.g. 2H TMDs), metallic 2D materials (e.g. IT TMDs), and insulating 2D materials (e.g. h-BN). TMDs have the chemical formula $MX_2$, where M is a transition metal such as titanium (Ti), zirconium (Zr), hafnium (Hf), vanadium (V), niobium (Nb), tantalum (Ta), molybdenum (Mo), tungsten (W), technetium (Tc), rhenium (Re), cobalt (Co), rhodium (Rh), iridium (Ir), nickel (Ni), palladium (Pd), platinum (Pt), and X is a chalcogen such as sulfur(S), selenium (Se) or tellurium (Te). For TMDs having various crystal structures, the most common crystal structure is the 2H-phase with trigonal symmetry, which results in semiconducting characteristics (e.g. $MoS_2$, $WS_2$, $MoSe_2$ or $WSe_2$). Another possible crystal structure of TMDs is the 1T phase, which results in metallic characteristics (e.g. $WTe_2$).

TMD bulk crystals are formed of monolayers bound to each other by Van-der-Waals attraction. TMD monolayers have a direct band gap, and may be used in electronic devices to form TMD-based field-effect transistors (TMD-FETs).

In some embodiments, a material of the channel layer 304 is or includes one or more types of TMDs (Transition Metal Dichalcogenides). In some embodiments, a material of the channel layer 104 is or includes $MoS_2$ or $WS_2$.

Figure 20:
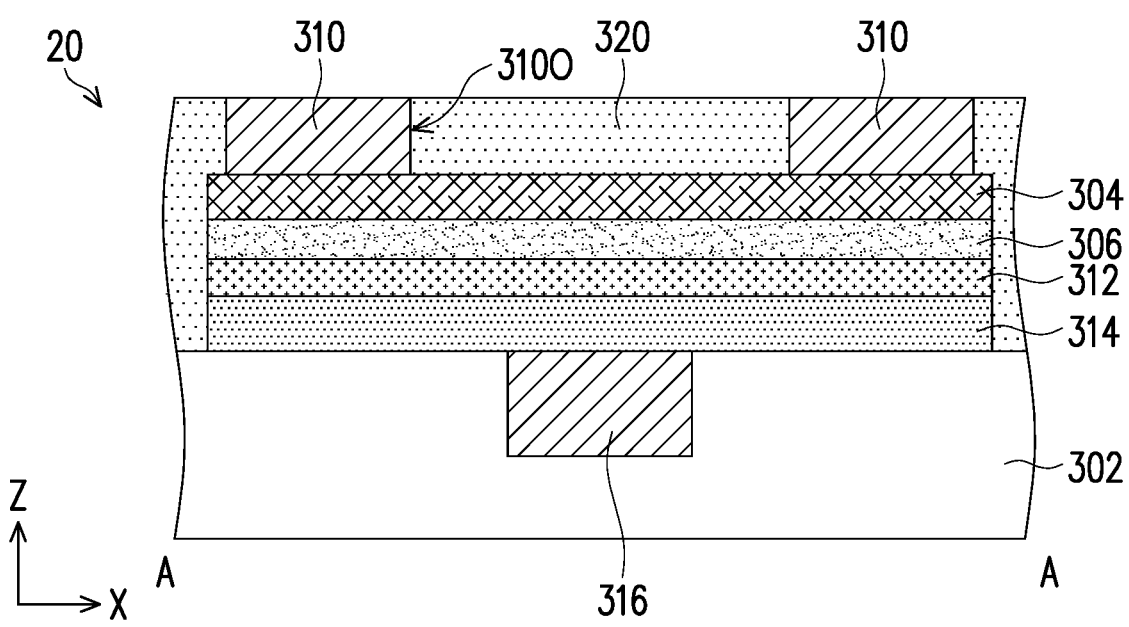
Figure 21:
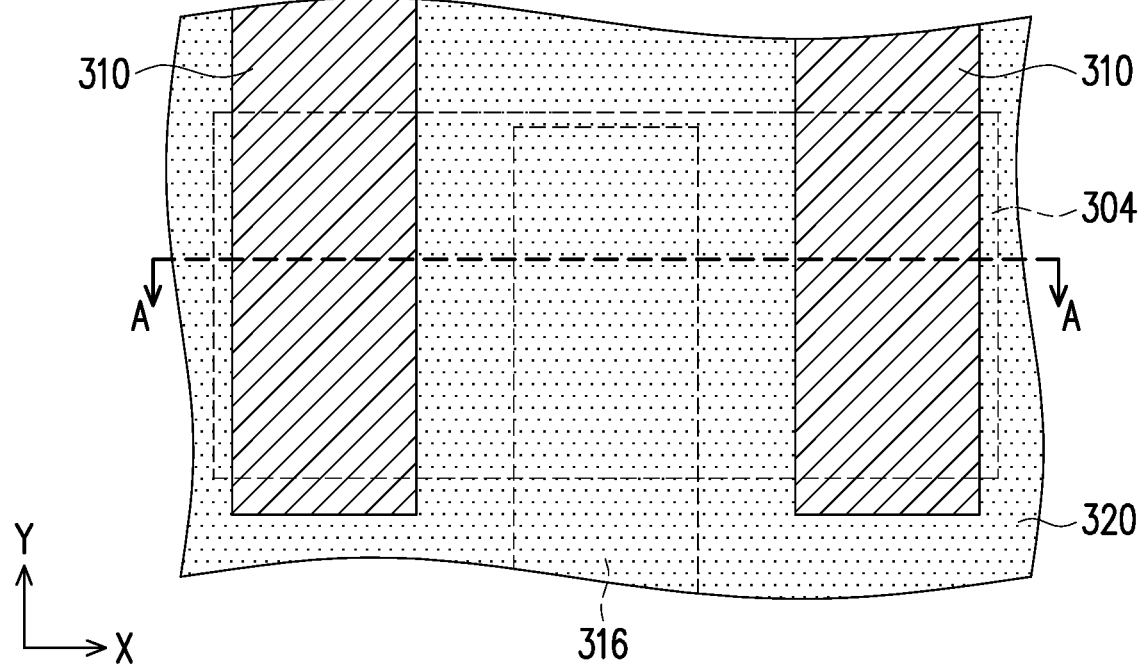

Referring to FIGS. 20 and 21 in some embodiments, a second dielectric layer 320 (an inter-layer dielectric layer of an interconnect structure) is formed over the channel layer 304 and source and drain terminals 310 are formed in openings 310O of the second dielectric layer 320.

FIG. 20 shows schematic cross-sectional views of a structure shown in FIG. 21 along cross-section line A-A. From the top view of FIG. 21 strip shaped patterns of the source and drain terminals 310 over the channel layer 304 extend along a direction Y. The gate structure 316 and the source and drain terminals 310 individually intersect with and cover the strip shaped patterns or be covered by the strip shaped pattern of the channel layer 304.

In some embodiments, the second dielectric layer 320 for capping a stack structure (the stack of the second hafnium-containing dielectric layer 314, the first hafnium-containing dielectric layer 312, the adhesion layer 306 and the channel layer 304) is formed over the stack structure and a top surface of the first dielectric layer 302. The second dielectric layer 320 may be or include the same material/or process as the first dielectric layer 302 or may include a different material/or process. In this example, the second dielectric layer 320 may be an un-patterned dielectric layer having a planar top surface. A thickness of second dielectric layer 320 may be in a range from approximately 5 nm to approximately 50 nm, such as from approximately 20 nm to approximately 40 nm, although other embodiments may include smaller and larger thicknesses. A removal process or patterning process the same as the first dielectric layer 302 is performed on the second dielectric layer 320 to remove a portion of the second dielectric layer 320 until portions of the channel layer 304 are revealed by the openings 310O defined in the second dielectric layer 320.

A conductive material layer (not shown) is deposited on the second dielectric layer 320 and fills the openings 310O defined in the second dielectric layer 320. The conductive material layer may be or include the same material/or process as the conductive material layer for forming first dielectric layer 302 or may include a different material/or process. A thickness of the conductive material layer may be in a range from approximately 10 nm to approximately 50 nm, such as from approximately 20 nm to approximately 40 nm, although smaller and larger thicknesses may also be used. In some embodiments, excess portions of the conductive material layer are removed until a top surface of the second dielectric layer 320 is revealed by a planarization process such as CMP to form the source and drain terminals 310. As seen in FIG. 20, the top surface of the second dielectric layer 320 is substantially flush with and levelled with top surfaces of the source and drain terminals 310.

In some embodiments, the channel layer 304 in contact with the source and drain terminals 310 functions as the channel region of a transistor, and the source and drain terminals 310 are electrically connected with the channel region (channel layer) of the transistor. In some embodiments, a transistor device 20 includes contacts (not shown) respectively in contact with the source and drain terminals 310 and the gate structure 316. In some embodiments, the transistor device 20 is a bottom-gated transistor structure.

A semiconductor device and a method of manufacturing thereof are provided. T semiconductor device comprises a composite hafnium-containing dielectric layer over the channel layer. The composite hafnium-containing dielectric layer includes a first hafnium-containing dielectric layer and a second hafnium-containing dielectric layer disposed over the first hafnium-containing dielectric layer. In some embodiments, the second hafnium-containing dielectric layer further includes zirconium. The dielectric constant of the second hafnium-containing dielectric layer is higher than the dielectric constant of the first hafnium-containing dielectric layer. Through the formation of the composite hafnium-containing dielectric layer, the formed semiconductor device offers an improved subthreshold swing (SS) performance and excellent transition rates between on and off states. Besides, the semiconductor device is formed with a reduced equivalent oxide thickness (EOT), and the semiconductor device maintains a low leakage current and a satisfactory breakdown voltage ($V_{BD}$) at the same time. Overall, the performance of the semiconductor device is enhanced.

In some embodiments of the present disclosure, a semiconductor device is described. The semiconductor device includes a channel layer disposed over a substrate, an adhesion layer, a first hafnium-containing dielectric layer, a second hafnium-containing dielectric layer, a gate structure, and source and drain terminals. The adhesion layer is disposed over the channel layer. The first hafnium-containing dielectric layer is disposed over the adhesion layer. The second hafnium-containing dielectric layer is disposed over the first hafnium-containing dielectric layer. The gate structure is disposed on the second hafnium-containing dielectric layer. The source and drain terminals are in contact with the channel layer and located at two opposite sides of the gate structure. The second hafnium-containing dielectric layer has a hafnium content lower than a hafnium content of the first hafnium-containing dielectric layer. A dielectric constant of the second hafnium-containing dielectric layer is larger than a dielectric constant of the first hafnium-containing dielectric layer.

In some embodiments of the present disclosure, a semiconductor device is described. A semiconductor device includes a channel layer, a hafnium oxide layer, an adhesion layer, a hafnium zirconium oxide layer, a gate structure, source and drain terminals. The channel layer, includes a low-dimensional material. The hafnium oxide layer is disposed over the channel layer. The adhesion layer is disposed between the channel layer and the hafnium oxide layer. The hafnium zirconium oxide layer is disposed on the hafnium oxide layer. There is an interface between the hafnium zirconium oxide layer and the hafnium oxide layer. The gate structure is disposed on the hafnium zirconium oxide layer. The source and drain terminals are disposed on the channel layer and in contact with the channel layer. A dielectric constant of the hafnium zirconium oxide layer is larger than a dielectric constant of the hafnium oxide layer.

In some embodiments of the present disclosure, a method for forming a semiconductor device is described. A method of manufacturing a semiconductor device includes forming a channel layer over a substrate; forming an adhesion layer over the channel layer; forming source and drain terminals on the channel layer; forming a first hafnium-containing dielectric layer over the channel layer; forming a second hafnium-containing dielectric layer over the first hafnium-containing dielectric layer; and forming a gate structure over the second hafnium-containing dielectric layer. The second hafnium-containing dielectric layer has a hafnium content lower than a hafnium content of the first hafnium-containing dielectric layer, and a dielectric constant of the second hafnium-containing dielectric layer is larger than a dielectric constant of the first hafnium-containing dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a channel layer disposed over a substrate;
an adhesion layer disposed over the channel layer;
a first hafnium-containing dielectric layer disposed over the adhesion layer;
a second hafnium-containing dielectric layer disposed over the first hafnium-containing dielectric layer;
a gate structure disposed on the second hafnium-containing dielectric layer; and source and drain terminals, in contact with the channel layer and located at two opposite sides of the gate structure,
wherein the second hafnium-containing dielectric layer has a hafnium content lower than a hafnium content of the first hafnium-containing dielectric layer, and a dielectric constant of the second hafnium-containing dielectric layer is larger than a dielectric constant of the first hafnium-containing dielectric layer.

2. The semiconductor device of claim 1, wherein the gate structure and the source and drain terminals are located at the same side of the channel layer, and the source and drain terminals are located between the channel layer and the first hafnium-containing dielectric layer and are in contact with the adhesion layer.

3. The semiconductor device of claim 1, wherein a material of the channel layer includes transition metal dichalcogenide, and a material of the adhesion layer includes aluminum oxide.

4. The semiconductor device of claim 1, wherein a thickness ratio of the second hafnium-containing dielectric layer to the first hafnium-containing dielectric layer is 1:1 to 10:1.

5. The semiconductor device of claim 1, wherein the second hafnium-containing dielectric layer has a thickness ranging from about 0.5 nm to about 5.0 nm.

6. The semiconductor device of claim 1, wherein the gate structure and the source and drain terminals are located at two opposite sides of the channel layer, and the adhesion layer is disposed between the channel layer and the first hafnium-containing dielectric layer.

7. The semiconductor device of claim 1, wherein a material of the first hafnium-containing dielectric layer includes hafnium oxide, and a material of the second hafnium-containing dielectric layer includes hafnium zirconium oxide.

8. The semiconductor device of claim 7, wherein the hafnium zirconium oxide of the second hafnium-containing dielectric layer is expressed as $Hf_xZr_{1-x}O_2$, and x is greater than zero and less than about 0.5.

9. The semiconductor device of claim 1, further comprising at least one additional hafnium-containing dielectric layer disposed between the second hafnium-containing dielectric layer and the gate structure.

10. The semiconductor device of claim 9, wherein a material of the second hafnium-containing dielectric layer includes hafnium zirconium oxide, and a material of the at least one additional hafnium-containing dielectric layer includes hafnium zirconium oxide, and a zirconium content of the at least one additional hafnium-containing dielectric layer is different from a zirconium content of the second hafnium-containing dielectric layer.

11. The semiconductor device of claim 9, wherein a material of the second hafnium-containing dielectric layer includes hafnium zirconium oxide, and a material of the at least one additional hafnium-containing dielectric layer includes hafnium zirconium oxide, and a zirconium content of the at least one additional hafnium-containing dielectric layer is substantially the same as a zirconium content of the second hafnium-containing dielectric layer.

12. The semiconductor device of claim 9, wherein the first hafnium-containing dielectric layer includes hafnium oxide, the second hafnium-containing dielectric layer and the at least one additional hafnium-containing dielectric layer include hafnium zirconium oxide, and the first hafnium-containing dielectric layer has a hafnium content higher than that of the second hafnium-containing dielectric layer and that of the at least one additional hafnium-containing dielectric layer.

13. A semiconductor device, comprising:
a channel layer, wherein the channel layer includes a low-dimensional material;
a hafnium oxide layer disposed over the channel layer;
an adhesion layer disposed between the channel layer and the hafnium oxide layer;
a hafnium zirconium oxide layer, disposed on the hafnium oxide layer, wherein there is an interface between the hafnium zirconium oxide layer and the hafnium oxide layer;

a gate structure disposed on the hafnium zirconium oxide layer; and
source and drain terminals, disposed on the channel layer and in contact with the channel layer,
wherein a dielectric constant of the hafnium zirconium oxide layer is larger than a dielectric constant of the hafnium oxide layer.

14. The semiconductor device of claim 13, further comprising a nitride layer below the channel layer.

15. The semiconductor device of claim 13, wherein the source and drain terminals are in contact with the adhesion layer, and the hafnium oxide layer is in contact with the source and drain terminals and the adhesion layer.

16. The semiconductor device of claim 13, wherein a material of the adhesion layer includes aluminum oxide, and the hafnium zirconium oxide layer includes $Hf_xZr_{1-x}O_2$, and the atomic ratio x is greater than zero and less than about 0.5.

17. The semiconductor device of claim 13, wherein a thickness ratio of the hafnium zirconium oxide layer to the hafnium oxide layer ranges from about 1.4:1 to about 5:1.

18. A method of manufacturing a semiconductor device, comprising:
forming a channel layer over a substrate;
forming an adhesion layer over the channel layer;
forming source and drain terminals on the channel layer;
forming a first hafnium-containing dielectric layer over the channel layer;
forming a second hafnium-containing dielectric layer over the first hafnium-containing dielectric layer; and
forming a gate structure over the second hafnium-containing dielectric layer,
wherein the second hafnium-containing dielectric layer has a hafnium content lower than a hafnium content of the first hafnium-containing dielectric layer, and a dielectric constant of the second hafnium-containing dielectric layer is larger than a dielectric constant of the first hafnium-containing dielectric layer.

19. The method of claim 18, wherein the source and drain terminals are formed on the channel layer before forming the first hafnium-containing dielectric layer.

20. The method of claim 18, wherein the source and drain terminals are formed on the channel layer after forming the channel layer.

* * * * *